United States Patent [19]
Shimizu

[11] Patent Number: 5,952,667
[45] Date of Patent: Sep. 14, 1999

[54] VARIABLE-AXIS STIGMATOR LENS AND CHARGED-PARTICLE-BEAM MICROLITHOGRAPHY APPARATUS COMPRISING SAME

[75] Inventor: Hiroyasu Shimizu, Kawasaki, Japan

[73] Assignee: Nikon Corporation, Tokyo, Japan

[21] Appl. No.: 08/891,527

[22] Filed: Jul. 11, 1997

[30] Foreign Application Priority Data

Jul. 25, 1996 [JP] Japan .................................... 8-196317

[51] Int. Cl.⁶ ........................ H01L 21/027; H01J 37/153
[52] U.S. Cl. ................................ 250/492.2; 250/492.23; 250/396 ML
[58] Field of Search .......................... 250/492.23, 492.2, 250/396 ML

[56] References Cited

U.S. PATENT DOCUMENTS

5,389,858   2/1995   Langner et al. ................. 250/396 ML
5,635,719   6/1997   Petric ............................. 250/396 ML

*Primary Examiner*—Jack I. Berman
*Attorney, Agent, or Firm*—Klarquist Sparkman Campbell Leigh & Whinston, LLP

[57] ABSTRACT

Charged-particle-beam microlithography apparatus are disclosed comprising a lens system, such as a variable axis lens (VAL) or variable axis immersion lens (VAIL), that causes a charged-particle-beam incident to an objective lens off-axis to be incident under the same conditions as if the beam were incident on-axis. The objective lens comprises astigmatism-correction deflectors that generate an astigmatism-correction field serving to correct astigmatism of the beam and generate a deflecting magnetic field that corrects the off-axis state in the astigmatism correction field relative to the charged-particle-beam. Thus, generation of aberrations is kept to a minimum even when the charged-particle-beam is incident off-axis.

14 Claims, 5 Drawing Sheets

VARIABLE-AXIS STIGMATOR LENS AND CHARGED-PARTICLE-BEAM MICROLITHOGRAPHY APPARATUS COMPRISING SAME

FIELD OF THE INVENTION

This invention pertains to apparatus used to perform microlithography for manufacturing semiconductor integrated circuits and the like. More specifically, the invention pertains to microlithography apparatus that transfer, by a charged-particle beam, a pattern defined by a mask to a sensitive substrate.

BACKGROUND OF THE INVENTION

Microlithography apparatus (pattern-transfer apparatus) employing a charged particle beam (e.g., electron beam) as an irradiation source are currently the subject of much research aimed at further decreasing the feature size of integrated circuits and the like to increase circuit density without sacrificing throughput. Such microlithography apparatus evolved from previous technology developed for such technical arenas as transmission electron microscopy and scanning electron microscopy. Thus, microlithography apparatus employing an electron beam, for example, employ electron lenses and deflectors to control the propagation of the electron beam in a usable way.

Figure 1:
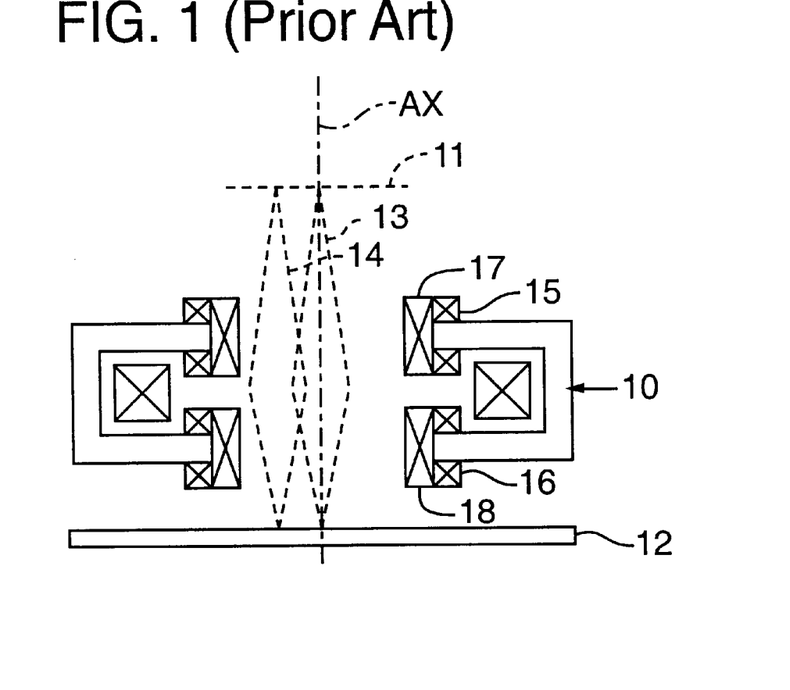
FIG. 1 is an elevational sectional view of a conventional objective lens as used in a conventional charged-particle beam microlithography apparatus.

FIG. 1 shows an objective lens 10 of a conventional charged-particle-beam microlithography apparatus. FIG. 1 also shows a reticle 11 and a substrate (e.g., wafer) 12 situated relative to the objective lens. Trajectory paths of the charged-particle beam are denoted 13 and 14, wherein the beam of path 13 extends along the optical axis AX (parallel to the Z axis) of the objective lens 10 and the beam of path 14 is laterally displaced from the optical axis AX. With the beam of path 14, the lens 10 typically exhibits substantial aberration. The aberration is more pronounced with increasing lateral displacement of the charged particle beam from the optical axis.

To provide some correction of such aberrations, conventional charged-particle-beam microlithography apparatus employ supplementary lenses or supplementary deflectors to cause the charged-particle beam to propagate under conditions that are the same as if the beam were propagating on-axis. Such lenses include "variable-axis lenses" (abbreviated VAL) or "variable-axis immersion lenses" (abbreviated VAIL). In FIG. 1, lenses 15 and 16 are VAL supplementary lenses and lenses 17 and 18 are VAL deflectors. The supplementary lenses 15, 16 and the supplementary deflectors 17, 18 are typically energized to a degree that depends upon the amount of off-axis lateral displacement of the charged-particle beam. To such end, the supplementary lenses 15, 16 generate a field represented by the following Equation (1):

$$b[z] = (x_0^2 + y_0^2) B''[z]/4 \qquad (1)$$

Figure 2A:
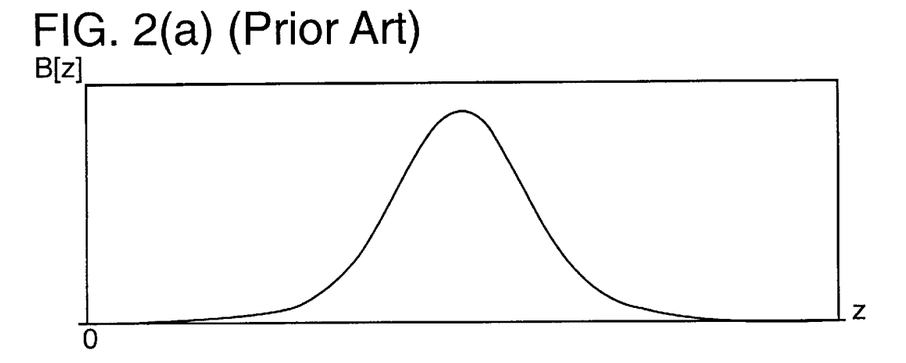
Figure 2B:
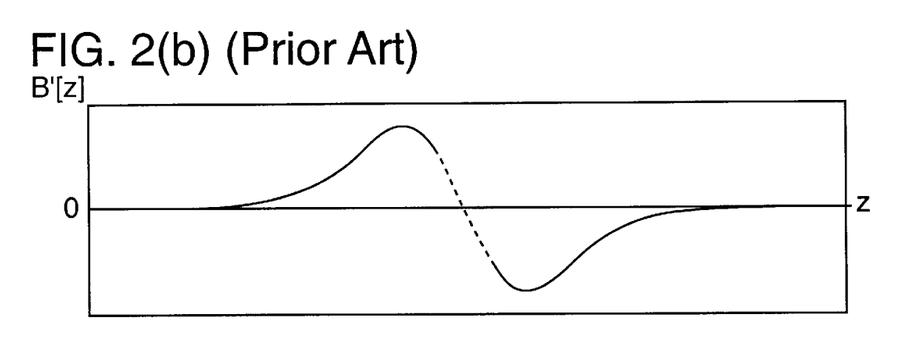
FIG. 2(b) is a plot of the first derivative B'[z] with respect to z.
Figure 2C:
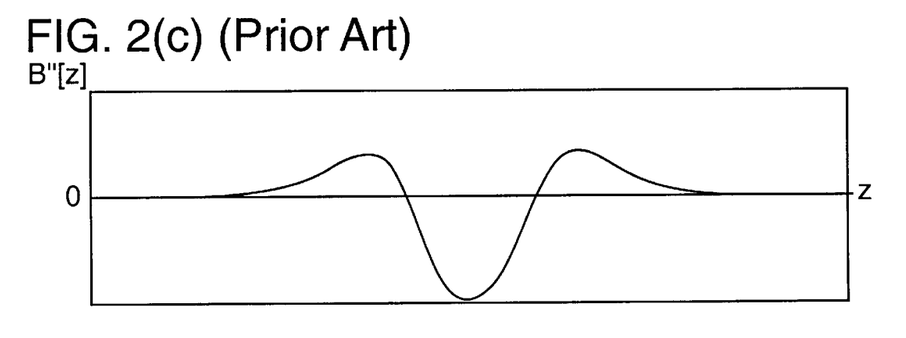
FIG. 2(c) is a plot of the second derivative B''[z] with respect to z.

The deflectors 17, 18 generate a deflection field represented by the following Equation (2):

$$(dx[z], dy[z]) = (x_0 B'[z]/2, y_0 B'[z]/2) \qquad (2)$$

wherein B[z] is the distribution of the on-axis field of the objective lens 10, and $(x_0, y_0)$ is the off-axis displacement, i.e., the location (when the optical axis is the origin in the incident plane of the at which lens) a charged-particle beam incident off-axis (beam of path 14) can pass through the objective lens 10 under nearly the same conditions as if the beam were incident on-axis. As a result, aberration is diminished. FIGS. 2(a)–2(c) are plots showing the distributions of B[z], the first derivative B'[z], and the second derivative B''[z] of B[z] with respect to z, wherein each horizontal axis is the Z axis and each vertical axis represents magnitude.

However, astigmatism remains a problem even though the charged-particle beam is deflected as described above.

Figure 3:
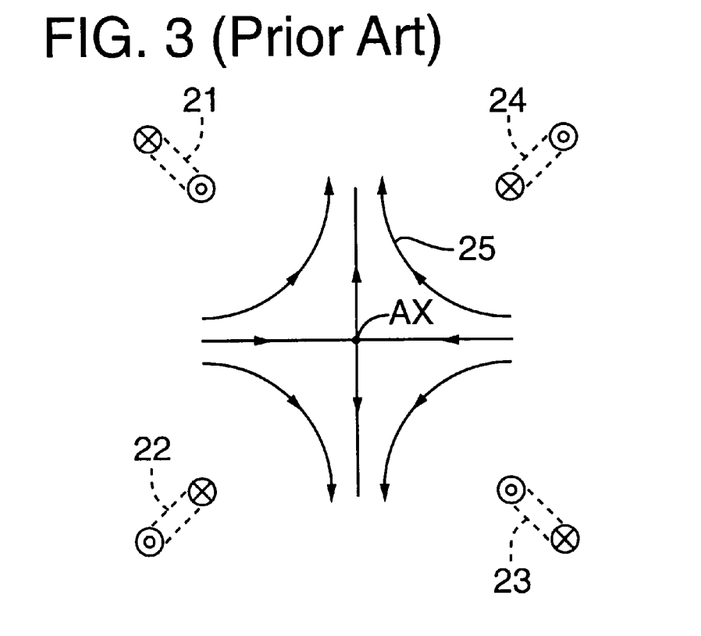
FIG. 3 is a drawing to explain operation of a conventional astigmatism compensator.

A conventional way to address the astigmatism problem is to insert an astigmatism compensator separate from the deflectors 17, 18 and the supplementary lenses 15, 16. A conventional astigmatism compensator is normally configured as an octapole coil. Four poles of the coil form an X-direction astigmatism-correction coil, and the other four poles of the coil form a Y-direction astigmatism-correction coil. The magnetic field formed by such a coil in the X-direction is shown in FIG. 3. Specifically, for example, a magnetic field 25 is formed by the tetrapole coils 21–24. Deflection fields are formed at positions away from the axis, while the field on the axis of the compensator is zero. However, since the charged-particle beam is mostly off-axis during exposure, new aberrations are generated even though such an astigmatism compensator is used.

SUMMARY OF THE INVENTION

An object of this invention is to provide a charged-particle-beam microlithography apparatus that can control the generation of aberrations of the charged-particle beam to a minimum even when the charged-particle beam is propagating off-axis.

According to one aspect of the invention, a charged-particle-beam microlithography apparatus is provided for transferring a pattern defined by a mask onto a sensitive substrate. According to a preferred embodiment, the apparatus comprises a charged-particle-beam irradiation system, a charged-particle-beam lens system situated downstream along an optical axis from the charged-particle-beam irradiation system, and an astigmatism-correction deflector system.

The charged-particle beam irradiation system is operable to direct a charged-particle beam from a charged-particle-beam source to the mask to irradiate a region of the mask with the charged-particle beam.

The charged-particle-beam lens system is operable to receive the charged-particle beam after the charged-particle beam has passed through the irradiated region of the mask. The lens system also selectively directs the charged-particle beam to a corresponding exposure region on the substrate. The lens system comprises a variable-axis lens that causes the charged-particle beam to pass on-axis through the lens even when the charged-particle beam is passing off-axis through any other portion of the apparatus.

The astigmatism-correction deflector system is operable to form an astigmatism-correction field and a deflecting magnetic field having an axis that is coincident with an axis of propagation of the charged-particle beam through the astigmatism-correction deflector. In other words, the astigmatism-correction deflector system, associated with a lens in the charged-particle lens system, is operable to cause a charged-particle beam entering the lens off-axis to enter the lens as if the charged-particle beam were on-axis.

The charged-particle-beam lens system preferably comprises a lens comprising a VAL supplementary lens and a VAL deflector. More preferably, the lens is an objective lens. The astigmatism-correction deflector system is preferably nested coaxially inside the VAL supplementary lens and the VAL deflector.

The astigmatism-correction deflector system is operable to produce an astigmatism-correction field ($S_x$, $S_y$), and a deflection-field distribution ($dS_x$, $dS_y$) that are proportional to a third derivative of an axial field distribution of the objective lens. Relative to a Z axis parallel to the optical axis and X and Y axes that are perpendicular to each other and to the Z axis, ($S_x$, $S_y$) is defined herein as the X, Y distribution of the astigmatism-correction field in a double-angle coordinate system, and ($dS_x$, $dS_y$) is defined as the X, Y distribution of the deflection field in an X, Y orthogonal coordinate system. $S_x$ is proportional to ($x_0 y_0$), and $S_y$ is proportional to ($-x_0^2 + y_0^2$); and $dS_x$ is proportional to ($x_0 \cdot (x_0^2 + y_0^2)$), and $dS_y$ is proportional to ($y_0 \cdot (x_0^2 + y_0^2)$). The charged-particle beam enters the objective lens off-axis at a location ($x_0$, $y_0$) in an X, Y orthogonal coordinate system. The double-angle x, y coordinates relative to the X, Y orthogonal coordinate system are defined by the equations:

$$x = (X^2 + Y^2)^{1/2} \cdot \cos 2\theta$$

$$y = (X^2 + Y^2)^{1/2} \cdot \sin 2\theta$$

$$\cos \theta = X/(X^2 + Y^2)^{1/2}$$

$$\sin \theta = Y/(X^2 + Y^2)^{1/2}$$

Further preferably, the astigmatism-correction deflector system comprises a single coil that forms the astigmatism-correction field and the deflection field. The deflection field preferably corrects the off-axis condition of the astigmatism-correction field relative to the charged-particle beam.

The foregoing and other features and advantages of the invention will be more apparent from the following detailed description that proceeds with reference to the accompanying drawings.

BRIEF DESCRIPTION OF THE DRAWINGS

FIGS. 2(a)–2(c) are plots of on-axis magnetic field distributions produced by the conventional objective lens of FIG. 1, wherein FIG. 2(a) is a plot of B[z]

FIGS. 5(a)–5(d) are plots of on-axis magnetic field distributions produced by the objective lens of FIG. 4, wherein FIG. 5(a) is a plot of B[z]

DETAILED DESCRIPTION

Figure 4:
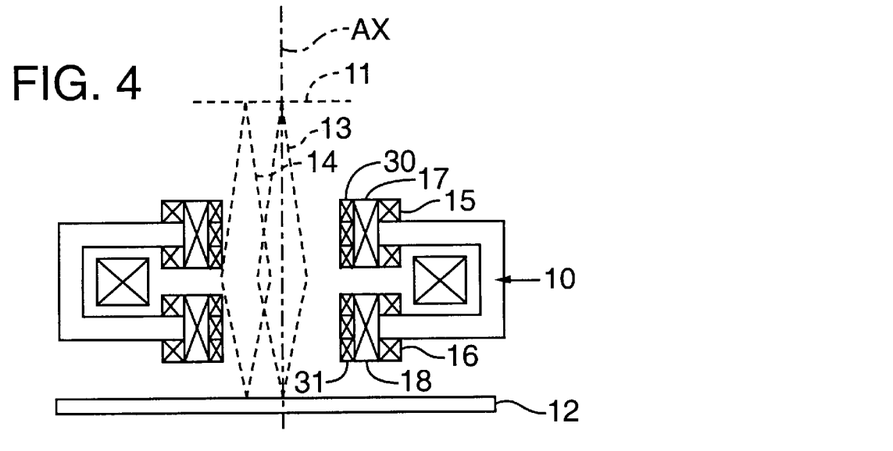
FIG. 4 is an elevational sectional view of an objective lens according to a preferred embodiment of the invention.
Figure 5A:
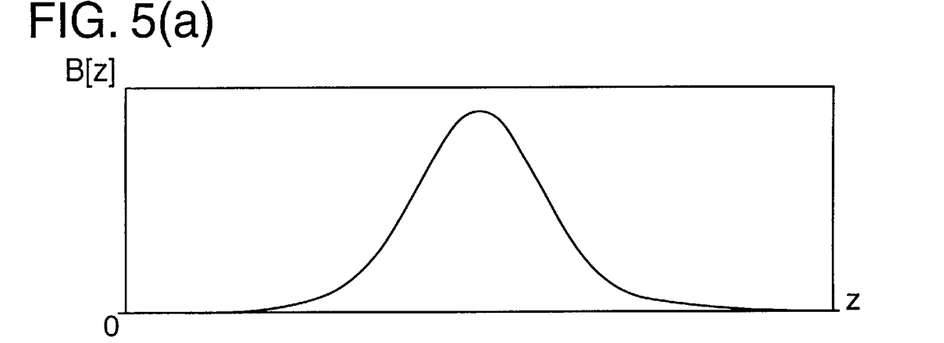
Figure 5B:
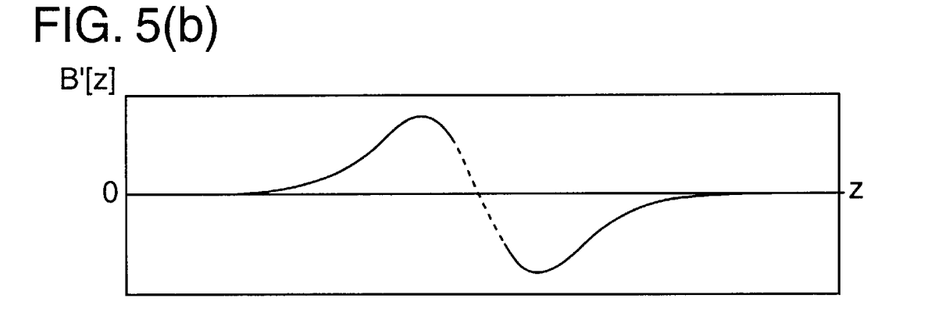
FIG. 5(b) is a plot of the first derivative B'[z] with respect to z.
Figure 5C:
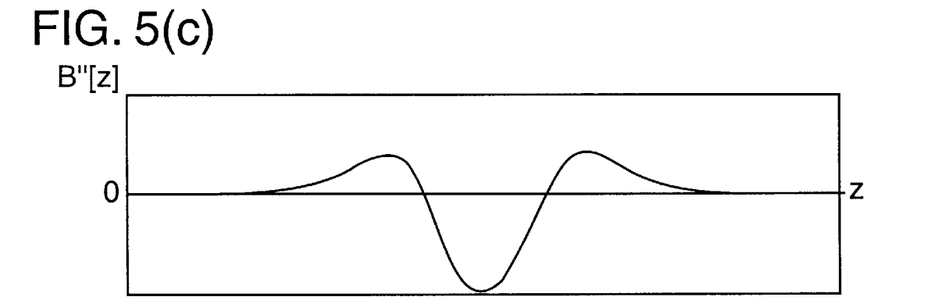
FIG. 5(c) is a plot of the second derivative B''[z] with respect to z.
Figure 5D:
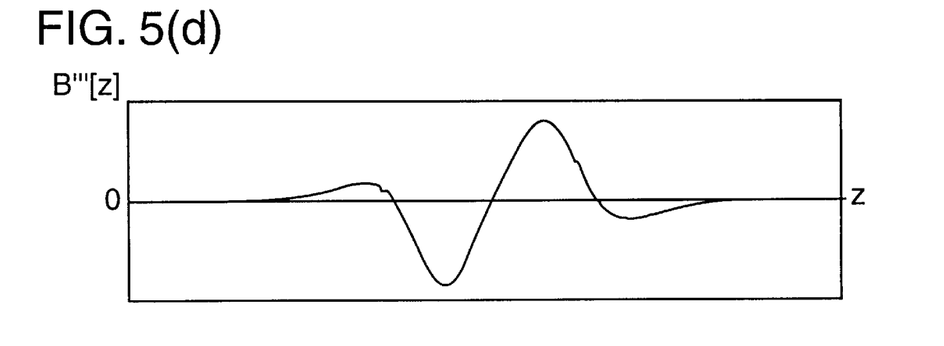
FIG. 5(d) is a plot of the third derivative B'''[z] with respect to z.

A preferred embodiment of an objective lens according to the invention is shown in FIG. 4, FIGS. 5(a)–5(d), and FIGS. 6(a)–6(b). A microlithography apparatus comprising an objective lens as shown in FIG. 4 is schematically shown in FIG. 7. In FIG. 4, components that are the same as in FIG. 1 have the same reference designators and are not described further.

The embodiment of FIG. 4 includes VAS (Variable Axis Stigmator) astigmatism-correction deflectors 30, 31 placed as shown relative to the objective lens 10, the VAL supplementary lenses 15, 16, and the VAL deflectors 17, 18. Each VAS deflector 30, 31 is constructed, e.g., of an octapole 3-stage coil (each octapole comprising two tetrapole sets). Coils forming a deflection field, discussed below, can be added to one of the tetrapole sets.

Astigmatism in a conventional astigmatism compensator can be expressed by a two-dimensional vector. A magnetic field can be generated that forms an astigmatism-correction vector ($S_x$, $S_y$) that cancels the astigmatism. In the following discussion, the ($S_x$, $S_y$) field is referred to as the "astigmatism-correction field". Each of the VAS astigmatism-correction deflectors 30, 31 preferably functions as an astigmatism compensator and as an off-axis correcting deflector. The astigmatism-compensator function is expressed by the astigmatism-correction field, while the deflector function is expressed by the deflection field. In other words, the VAS astigmatism-correction deflectors 30, 31 are excited so as to form an astigmatism-correcting field distribution expressed by the following Equation (3):

$$(S_x[z], S_y[z]) = (x_0 y_0 B'''[Z]/16, (-x_0^2 y_0^2) B'''[Z]/32) \qquad (3)$$

The tetrapole coils of the VAS astigmatism-correction deflectors 30, 31 are excited so as to form a deflection-field distribution expressed by the following Equation (4):

$$(dS_x[z], dS_y[Z]) = (x_0(x_0^2 + y_0^2) B'''[z]/16, y_0(x_0^2 + y_0^2) B'''[z]/16) \qquad (4)$$

wherein ($x_0$, $y_0$) is the off-axis amount in an X, Y orthogonal coordinate system.

FIGS. 5(a)–5(d) are graphs roughly showing B[z] and the first derivative B'[z], the second derivative B''[z], and the third derivative B'''[z] of B[z], respectively. In the graphs, the abscissa is the Z axis and the ordinate represents magnitude.

Figure 6A:
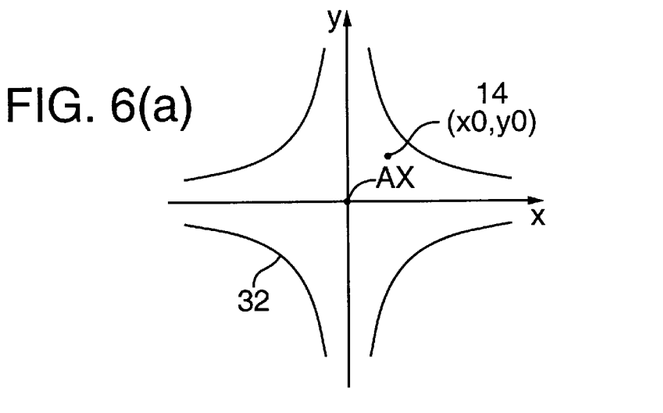
FIGS. 6(a) and 6(b) are drawings explaining the astigmatism-correction field and deflection field achieved with the lens of FIG. 4.
Figure 6B:
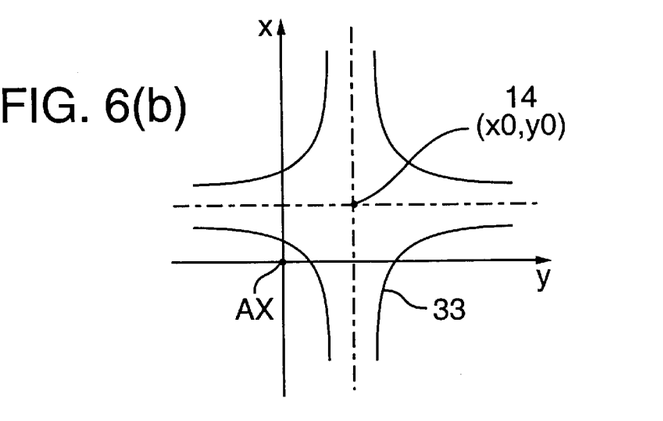
Figure 7:
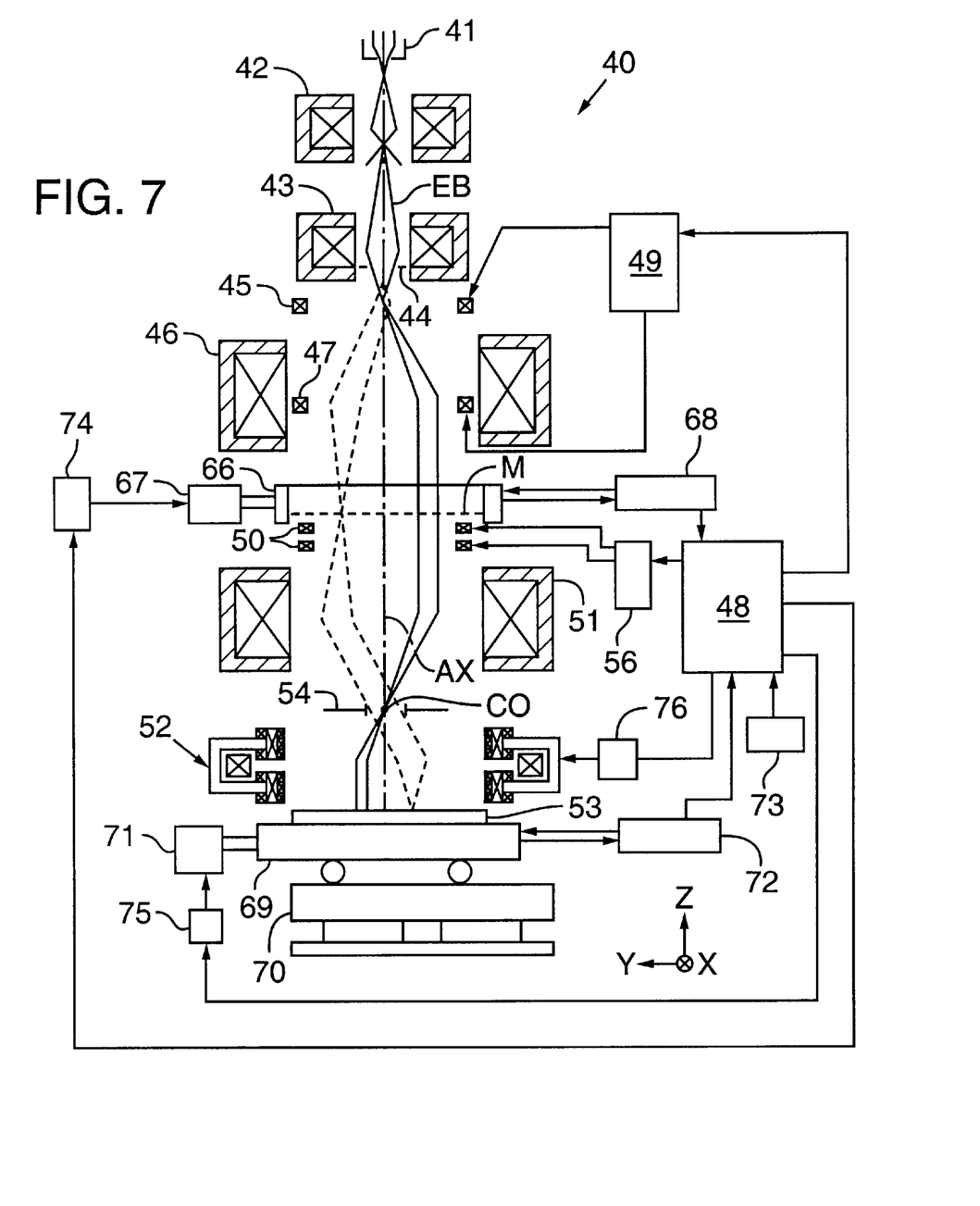
FIG. 7 is a schematic elevational view of a charged-particle-beam microlithography apparatus according to the invention incorporating an objective lens as shown in FIG. 4.

FIGS. 6(a)–6(b) show the general concept of an off-axis astigmatism-correction field. FIG. 6(a) depicts the magnetic field formed by a conventional astigmatism compensator comprising a tetrapole coil. The axis of the astigmatism-correction field 32 (perpendicular to the plane of the page) and the optical axis AX are coincident, and ($x_0$, $y_0$) in the X, Y orthogonal coordinate system is the location of the path of the charged-particle-beam 14 (FIG. 4) that is incident off-axis. FIG. 6(b) shows the magnetic field formed by the VAS astigmatism-correction deflectors 30, 31. The axis passing (perpendicular to the plane of the page) through the coordinates ($x_0$, $y_0$) and the axis of the astigmatism-correction field 33 are now coincident. This is equivalent to actually displacing the conventional astigmatism compensator toward the charged-particle beam 14 so that the charged-particle beam 14 propagates along the axis of the astigmatism compensator. As a result, in FIG. 6(b), the conditions are virtually the same for the charged-particle beam 14 propagating off-axis as for a charged-particle beam propagating on the axis AX. Consequently, the production of new aberrations by attempting to compensate for astigmatism in the off-axis beam is avoided.

In the foregoing discussion, an astigmatism-correction field was formed by octapole coils that comprise the VAS astigmatism-correction deflectors 30, 31. A deflection field coil was added to one of the tetrapole coil sets of the octapole. In the event that the distribution of the astigmatism-correction field is seen as nearly matching the distribution of the deflection field, the field can be formed by a single octapole coil without adding a deflection field coil. This allows simplification of the design since the space occupied by the coil and/or associated wiring is smaller. Another advantage is less power consumption since the magnetic field forming the astigmatism-correction field and the deflection field do not cancel each other.

The various embodiments described above allow correction of an "off-axis condition" of an astigmatism-correction field. Thus, a charged-particle beam that is propagating off-axis is incident on the mask under conditions that are the same as if the beam were propagating on-axis. As a result, aberrations and distortions are minimized without generation of any new aberrations. Since the astigmatism-correction field and the deflection field can be formed by the same coil, design simplification is achieved with less power consumption.

A microlithography apparatus 40 incorporating the objective lens of FIG. 4 is schematically shown in FIG. 7. In FIG. 7 the Z axis is parallel to the optical axis AX of the apparatus 40, the X axis is perpendicular to the plane of the page, and the Y axis is parallel to the plane of the page but perpendicular to the Z axis. The apparatus 40 of FIG. 7 is adapted for use with a "partitioned mask" as known in the art, but it will be understood that the apparatus is not limited to use with such masks. Also, although FIG. 7 depicts an apparatus usable with an electron beam, it will be understood that such an apparatus can alternatively be used with any of various other charged particle beams such as an ion beam.

As a representative charged-particle beam, an electron beam EB is emitted from an electron gun 41. The electron beam EB is focused by a first condenser lens 42, then by a second condenser lens 43. An aperture plate 44 is typically situated in proximity to the second condenser lens 43. The electron beam EB passes through an aperture defined by the aperture plate 44 and is deflected primarily in the Y direction by a first field-selection deflector 45. The electron beam EB is then made into a parallel beam by a third condenser lens 46 and deflected back by a second field-selection deflector 47 to an irradiation region on the mask M. The field-selection deflectors 45, 47 are preferably electromagnetic deflectors exhibiting amounts of deflection that are controlled by a main controller 48 via a deflection regulator 49. The main controller 48 also controls the overall operation of the apparatus 40.

The path of the electron beam EB indicated by the solid lines shows the conjugate relationship of the crossover image, while the path indicated by the dashed lines shows the conjugate relationship of the mask-pattern image.

The plane in which the aperture plate 44 is situated is conjugate with the plane in which the mask M is situated, so that the projected image of the aperture of the aperture plate 44 is the irradiation region 35 on the mask M.

After the electron beam EB passes through the mask M, the beam is deflected by a specified amount by deflectors 50. The beam is then formed into a crossover image CO by a projection lens 51 and focused by an objective lens 52 onto a substrate 53 coated with a suitable electron-beam resist. Thus, an image of the irradiated region of the mask M is transferred to a corresponding region on the substrate 53.

The objective lens 52 shown in FIG. 7 is configured the same as the objective lens shown in FIG. 4. The objective lens 52 includes the VAS astigmatism-correction deflectors 30, 31, the VAL supplementary lenses 15, 16, and the VAL deflectors 17, 18 as discussed above with respect to FIG. 4. An aperture stop 54 is situated where the crossover image CO is formed.

The amount of deflection imparted by the deflectors 50 is regulated by a deflection regulator 56 connected to the main controller 48. Similarly, the amount of deflection imparted by the VAS astigmatism-correction deflectors 30, 31, the VAL supplementary lenses 15, 16, and the VAL deflectors 17, 18 of the objective lens 52 is regulated by a regulator 76 responsive to signals from the main controller 48.

The mask M is mounted on a mask stage 66 parallel with the XY plane. The mask stage 66 is movable continuously in the X direction, and step-wise in the Y direction, by an actuator 67. The position of the mask stage 66 in the XY plane is detected by a laser interferometer 68 that outputs data to the main controller 48.

The substrate 53 is held on a substrate stage 69 mounted on a specimen base 70 parallel with the XY plane. In the X-Y directions, the substrate stage 69 is movable by an actuator 71 continuously in the X direction in a direction opposite the direction in which the mask stage 66 is moved, and can be moved step-wise in the Y direction. The substrate stage 69 is moved in the opposite direction, in the X dimension, from the movement of the mask stage 66 because the mask-pattern image is typically inverted by the lenses 51, 52. The position of the substrate stage 69 in the XY plane is detected by a laser interferometer 72 that outputs data to the main controller 48.

The main controller 48 calculates the amount of required deflection of the electron beam EB by the field-selection deflectors 45, 47 and the deflectors 50. The main controller 48 also calculates information required to control movement of the mask stage 66 and the substrate stage 69 (e.g., the position and movement velocity of each) based on exposure data produced by a data-input device 73 (e.g., keyboard, mouse, touchscreen or other suitable data-entry device) and on position data for the mask stage 66 and substrate stage 69 detected by the respective laser interferometers 68, 72. The calculated information concerning deflection amount is output from the main controller 48 to the deflection regulator 49 and the deflection-correction regulator 56. These regulators set the amount of deflection effected by each of the field-selection deflectors 45, 47 and the deflectors 50.

The calculation results regarding movement of the mask stage 66 and the substrate stage 69 are output to respective drivers 74 and 75. These drivers 74, 75 control the operation of the actuators 67 and 71, respectively, so that the stages 66, 69 operate according to the calculation results.

As indicated above, the main controller 48 can be provided with an appropriate data-input device 73. For example, the data-input device 73 can be operable to read magnetically recorded information, or operable to read exposure data that have been pre-registered on the mask 30 or substrate 53.

Whereas the invention has been described in connection with preferred and alternative embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A charged-particle-beam microlithography apparatus for transferring a pattern defined by a mask onto a sensitive substrate, the apparatus comprising:

(a) a charged-particle-beam irradiation system for directing a charged-particle beam from a charged-particle-beam source to the mask to irradiate a region of the mask with the charged-particle beam;

(b) a charged-particle-beam lens system situated downstream along an optical axis from the charged-particlebeam irradiation system, the lens system receiving the charged-particle beam after the charged-particle beam has passed through the irradiated region of the mask and selectively directing the charged-particle beam to a corresponding exposure region on the substrate, the lens system comprising a variable-axis lens having a lens axis, the variable-axis lens being operable to shift its lens axis relative to the optical axis so as to cause the charged-particle beam to pass through the variable-axis lens along the lens axis when the charged-particle beam is incident to the variable-axis lens along a propagation path displaced from the optical axis; and (c) an astigmatism-correction deflector system that forms an astigmatism-correction field and a deflecting magnetic field having an axis that is coincident with an axis of propagation of the charged-particle beam through the variable-axis lens, the astigmatism-correction deflector system producing an astigmatism-correction field $(S_x, S_y)$ and a deflection-field distribution $(dS_x, dS_y)$ that are proportional to a third derivative of an axial field distribution of a lens of the charged-particle-beam lens system.

2. The apparatus of claim 1, wherein the charged-particle-beam lens system comprises an objective lens.

3. The apparatus of claim 2, wherein the objective lens comprises a VAL supplementary lens and a VAL deflector.

4. The apparatus of claim 3, wherein the objective lens comprises the astigmatism-correction deflector system.

5. The apparatus of claim 4, wherein the astigmatism-correction deflector system comprises multiple VAS astigmatism-correction deflectors.

6. The apparatus of claim 5, wherein the VAS astigmatism-correction deflectors are nested coaxially with respect to the VAL supplementary lens and the VAL deflector.

7. The apparatus of claim 5, wherein each VAS astigmatism-correction deflector comprises an octapole three-stage coil, each octapole comprising two sets of tetrapoles.

8. The apparatus of claim 1, wherein, relative to a Z axis parallel to the optical axis and X and Y axes which are perpendicular to each other and to the Z axis, $(S_x, S_y)$ is the X, Y distribution of the astigmatism correction field in a double-angle coordinate system, and $(dS_x, dS_y)$ is the X, Y distribution of the deflection field in an X, Y orthogonal coordinate system.

9. The apparatus of claim 8, wherein:

$S_x$ is proportional to $(x_0 y_0)$, and $S_y$ is proportional to $(-x_0^2 + y_0^2)$;

$dS_x$ is proportional to $(x_0 \cdot (x_0^2 + y_0^2))$ and $dS_y$ is proportional to $(y_0 \cdot (x_0^2 + y_0^2))$; and the charged-particle beam enters the lens off-axis at a location $(x_0, y_0)$ in an X, Y orthogonal coordinate system.

10. The apparatus of claim 4, wherein the astigmatism-correction deflector system produces an astigmatism-correction field $(S_x, S_y)$, and a deflection-field distribution $(dS_x, dS_y)$ that are proportional to a third derivative of an axial field distribution of the objective lens.

11. The apparatus of claim 10, wherein, relative to a Z axis parallel to the optical axis and X and Y axes which are perpendicular to each other and to the Z axis, $(S_x, S_y)$ is the X, Y distribution of the astigmatism correction field in a double-angle coordinate system, and $(dS_x, dS_y)$ is the X, Y distribution of the deflection field in an X, Y orthogonal coordinate system.

12. The charged-particle-beam device disclosed in claim 11, wherein:

$S_x$ is proportional to $(x_0 y_0)$, and $S_y$ is proportional to $(-x_0^2 + y_0^2)$;

$dS_x$ is proportional to $(x_0 \cdot (x_0^2 + y_0^2))$, and $dS_y$ is proportional to $(y_0 \cdot (x_0^2 + y_0^2))$; and the charged-particle beam enters the objective lens off-axis at a location $(x_0, y_0)$ in an X, Y orthogonal coordinate system.

13. The apparatus of claim 12, wherein the double-angle x, y coordinates relative to the X, Y orthogonal coordinate system are defined by the equations:

$x = (X^2 + Y^2)^{1/2} \cdot \cos 2\theta$ $y = (X^2 + Y^2)^{1/2} \cdot \sin 2\theta$ $\cos \theta = X/(X^2 + Y^2)^{1/2}$ $\sin \theta = Y/(X^2 + Y^2)^{1/2}$.

14. The apparatus of claim 1, wherein the astigmatism-correction deflector system comprises a single coil that forms the astigmatism correction field and the deflection field.

* * * * *

UNITED STATES PATENT AND TRADEMARK OFFICE
CERTIFICATE OF CORRECTION

PATENT NO. : 5,952,667
DATED : September 14, 1999
INVENTOR(S) : Hiroyasu Shimizu It is certified that error appears in the above-identified patent and that said Letters Patent is hereby corrected as shown below:

In the Specification:

Column 1, line 17, "charged particle beam" should be --charged-particle beam--.

Column 1, line 38, "charged particle beam" should be --charged-particle beam--.

Column 2, line 40, "charged-particle beam irradiation system" should be --charged-particle-beam irradiation system --.

Column 2, line 59, "charged-particle lens system" should be --charged-particle-beam lens system--.

Column 3, lines 38-39, "charged-particle beam microlithography apparatus" should be --charged-particle-beam microlithography apparatus--.

In the Claims:

Column 8, line 4, claim 9, "$(x_0 \cdot (x_0^2 + y_0^2)$" should be --$(x_0 \cdot (x_0^2 + y_0^2))$--.

Signed and Sealed this

Seventeenth Day of April, 2001

Attest:

NICHOLAS P. GODICI

*Attesting Officer*         *Acting Director of the United States Patent and Trademark Office*